(12) United States Patent  
Forbes

(10) Patent No.: US 7,271,445 B2
(45) Date of Patent: Sep. 18, 2007

(54) ULTRA-THIN SEMICONDUCTORS BONDED ON GLASS SUBSTRATES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 10/931,553

(22) Filed: Aug. 31, 2004

(65) Prior Publication Data

US 2005/0023612 A1 Feb. 3, 2005

Related U.S. Application Data

(62) Division of application No. 10/443,340, filed on May 21, 2003.

(51) Int. Cl.
 *H01L 27/01* (2006.01)
(52) U.S. Cl. ............ 257/347; 257/350; 257/351; 257/E21.32; 257/E21.561; 257/E21.112; 438/149
(58) Field of Classification Search ........ 257/347–354, 257/507, E21.32, E21.561, E27.112; 438/149
See application file for complete search history.

(56) References Cited

U.S. PATENT DOCUMENTS

| | | |
|---|---|---|
| 3,953,839 A | 4/1976 | Dennison et al. |
| 4,241,359 A | 12/1980 | Izumi et al. |
| 4,314,595 A | 2/1982 | Yamamoto et al. |
| 4,322,980 A * | 4/1982 | Suzuki et al. ............ 73/727 |
| 4,523,975 A | 6/1985 | Groves et al. |
| 4,589,928 A | 5/1986 | Dalton et al. |
| 4,631,234 A | 12/1986 | Larrabee |
| 4,717,681 A | 1/1988 | Curran |
| 4,962,051 A | 10/1990 | Liaw |
| 5,027,101 A | 6/1991 | Morrill, Jr. |
| 5,098,852 A | 3/1992 | Niki et al. |
| 5,234,535 A | 8/1993 | Beyer et al. |

(Continued)

FOREIGN PATENT DOCUMENTS

EP 434984 9/1991

(Continued)

OTHER PUBLICATIONS

"Cornell Demonstrates a Universal Substrate", *Compound Semiconductor*, 3(2), (Mar./Apr. 1997), 27-29.

(Continued)

*Primary Examiner*—Sue A. Purvis
*Assistant Examiner*—Scott R. Wilson
(74) *Attorney, Agent, or Firm*—Schwegman, Lundberg, Woessner & Kluth, P.A.

(57) ABSTRACT

A method for forming a semiconductor on insulator structure includes providing a glass substrate, providing a semiconductor wafer, and performing a bonding cut process on the semiconductor wafer and the glass substrate to provide a thin semiconductor layer bonded to the glass substrate. The thin semiconductor layer is formed to a thickness such that it does not yield due to temperature-induced strain at device processing temperatures. An ultra-thin silicon layer bonded to a glass substrate, selected from a group consisting of a fused silica substrate, a fused quartz substrate, and a borosilicate glass substrate, provides a silicon on insulator wafer in which circuitry for electronic devices is fabricated.

32 Claims, 3 Drawing Sheets

U.S. PATENT DOCUMENTS

| | | |
|---|---|---|
| 5,343,064 A * | 8/1994 | Spangler et al. ............ 257/350 |
| 5,426,061 A | 6/1995 | Sopori |
| 5,441,591 A | 8/1995 | Imthurn et al. |
| 5,443,661 A | 8/1995 | Oguro et al. |
| 5,461,243 A | 10/1995 | Ek et al. |
| 5,471,180 A | 11/1995 | Brommer et al. |
| 5,482,869 A | 1/1996 | Kohyama |
| 5,487,999 A | 1/1996 | Farnworth |
| 5,526,449 A | 6/1996 | Meade et al. |
| 5,646,053 A | 7/1997 | Schepis |
| 5,656,886 A | 8/1997 | Westphal et al. |
| 5,661,044 A | 8/1997 | Holland et al. |
| 5,673,223 A | 9/1997 | Park |
| 5,679,475 A * | 10/1997 | Yamagata et al. .......... 428/698 |
| 5,691,230 A | 11/1997 | Forbes |
| 5,735,949 A | 4/1998 | Mantl et al. |
| 5,739,796 A | 4/1998 | Jasper et al. |
| 5,759,898 A | 6/1998 | Ek et al. |
| 5,773,152 A | 6/1998 | Okonogi |
| 5,789,859 A | 8/1998 | Watkins et al. |
| 5,840,590 A | 11/1998 | Myers, Jr. et al. |
| 5,854,501 A | 12/1998 | Kao |
| 5,858,819 A * | 1/1999 | Miyasaka .................... 438/149 |
| 5,877,070 A | 3/1999 | Goesele et al. |
| 5,879,996 A | 3/1999 | Forbes |
| 5,900,652 A | 5/1999 | Battaglia et al. |
| 5,926,740 A | 7/1999 | Forbes et al. |
| 5,949,102 A | 9/1999 | Saida et al. |
| 5,963,817 A | 10/1999 | Chu et al. |
| 5,987,200 A | 11/1999 | Fleming et al. |
| 5,991,225 A * | 11/1999 | Forbes et al. .......... 365/230.06 |
| 5,997,378 A | 12/1999 | Dynka et al. |
| 5,999,308 A | 12/1999 | Nelson et al. |
| 6,001,711 A | 12/1999 | Hashimoto |
| 6,022,793 A | 2/2000 | Wijaranakula et al. |
| 6,028,436 A | 2/2000 | Akram et al. |
| 6,049,106 A | 4/2000 | Forbes |
| 6,054,808 A | 4/2000 | Watkins et al. |
| 6,075,640 A | 6/2000 | Nelson |
| 6,077,792 A | 6/2000 | Farrar |
| 6,083,324 A | 7/2000 | Henley et al. |
| 6,093,623 A | 7/2000 | Forbes |
| 6,093,624 A | 7/2000 | Letavic et al. |
| 6,096,433 A | 8/2000 | Kikuchi et al. |
| 6,103,598 A | 8/2000 | Yamagata et al. |
| 6,107,661 A | 8/2000 | Okabe et al. |
| 6,110,793 A | 8/2000 | Lee et al. |
| 6,127,777 A | 10/2000 | Watkins et al. |
| 6,136,666 A | 10/2000 | So |
| 6,139,626 A | 10/2000 | Norris et al. |
| 6,143,628 A | 11/2000 | Sato et al. |
| 6,162,657 A | 12/2000 | Schiele et al. |
| 6,172,456 B1 | 1/2001 | Cathey et al. |
| 6,174,784 B1 | 1/2001 | Forbes |
| 6,175,242 B1 | 1/2001 | Akram et al. |
| 6,180,487 B1 | 1/2001 | Lin |
| 6,204,145 B1 | 3/2001 | Noble |
| 6,228,694 B1 | 5/2001 | Doyle et al. |
| 6,242,324 B1 | 6/2001 | Kub et al. |
| 6,251,751 B1 | 6/2001 | Chu et al. |
| 6,261,876 B1 | 7/2001 | Crowder et al. |
| 6,274,457 B1 | 8/2001 | Sakai et al. |
| 6,274,460 B1 | 8/2001 | Delgado et al. |
| 6,309,907 B1 | 10/2001 | Forbes et al. |
| 6,309,950 B1 | 10/2001 | Forbes |
| 6,315,826 B1 | 11/2001 | Muramatsu |
| 6,328,620 B1 | 12/2001 | Hu |
| 6,328,796 B1 | 12/2001 | Kub et al. |
| 6,338,805 B1 | 1/2002 | Anderson |
| 6,339,011 B1 | 1/2002 | Gonzalez et al. |
| 6,351,028 B1 | 2/2002 | Akram |
| 6,368,938 B1 | 4/2002 | Usenko |
| 6,376,336 B1 | 4/2002 | Buynoski |
| 6,377,070 B1 | 4/2002 | Forbes |
| 6,383,924 B1 | 5/2002 | Farrar et al. |
| 6,387,732 B1 | 5/2002 | Akram |
| 6,391,738 B2 | 5/2002 | Moore |
| 6,392,430 B1 | 5/2002 | Akram et al. |
| 6,413,827 B2 | 7/2002 | Farrar |
| 6,423,613 B1 | 7/2002 | Geusic |
| 6,424,001 B1 | 7/2002 | Forbes et al. |
| 6,436,187 B1 | 8/2002 | Patel et al. |
| 6,444,534 B1 | 9/2002 | Maszara |
| 6,448,157 B1 | 9/2002 | Okonogi |
| 6,448,601 B1 | 9/2002 | Forbes et al. |
| 6,451,672 B1 | 9/2002 | Caruso et al. |
| 6,452,713 B1 | 9/2002 | White |
| 6,455,397 B1 | 9/2002 | Belford |
| 6,461,933 B2 | 10/2002 | Houston |
| 6,465,873 B1 | 10/2002 | Gonzalez |
| 6,469,532 B2 | 10/2002 | Akram et al. |
| 6,476,434 B1 | 11/2002 | Noble et al. |
| 6,478,883 B1 | 11/2002 | Tamatsuka et al. |
| 6,486,008 B1 | 11/2002 | Lee |
| 6,489,183 B1 | 12/2002 | Farnworth |
| 6,496,034 B2 | 12/2002 | Forbes et al. |
| 6,497,763 B2 | 12/2002 | Kub et al. |
| 6,514,836 B2 | 2/2003 | Belford |
| 6,515,335 B1 | 2/2003 | Christiansen et al. |
| 6,531,727 B2 | 3/2003 | Forbes et al. |
| 6,537,856 B2 | 3/2003 | Akram |
| 6,538,330 B1 | 3/2003 | Forbes |
| 6,541,356 B2 | 4/2003 | Fogel et al. |
| 6,542,682 B2 | 4/2003 | Cotteverte et al. |
| 6,559,491 B2 | 5/2003 | Forbes et al. |
| 6,566,682 B2 | 5/2003 | Forbes |
| 6,576,993 B2 | 6/2003 | Akram |
| 6,579,738 B2 | 6/2003 | Farrar et al. |
| 6,582,512 B2 | 6/2003 | Geusic et al. |
| 6,583,052 B2 | 6/2003 | Shin et al. |
| 6,583,437 B2 | 6/2003 | Mizuno et al. |
| 6,593,625 B2 | 7/2003 | Christiansen et al. |
| 6,597,203 B2 | 7/2003 | Forbes |
| 6,620,683 B1 | 9/2003 | Lin et al. |
| 6,624,006 B2 | 9/2003 | Akram |
| 6,630,713 B2 | 10/2003 | Geusic |
| 6,642,123 B2 | 11/2003 | Mun et al. |
| 6,646,458 B2 | 11/2003 | Akram et al. |
| 6,649,476 B2 | 11/2003 | Forbes |
| 6,649,480 B2 | 11/2003 | Fitzgerald et al. |
| 6,649,492 B2 | 11/2003 | Chu et al. |
| 6,656,782 B2 | 12/2003 | Skotnicki et al. |
| 6,656,822 B2 | 12/2003 | Doyle et al. |
| 6,689,671 B1 | 2/2004 | Yu et al. |
| 6,703,293 B2 | 3/2004 | Tweet et al. |
| 6,703,648 B1 | 3/2004 | Xiang et al. |
| 6,717,216 B1 | 4/2004 | Doris et al. |
| 6,740,913 B2 | 5/2004 | Doyle et al. |
| 6,812,508 B2 | 11/2004 | Fukumi |
| 6,825,102 B1 | 11/2004 | Bedell et al. |
| 6,902,616 B1 | 6/2005 | Yamazaki et al. |
| 6,929,984 B2 | 8/2005 | Forbes et al. |
| 6,963,078 B2 | 11/2005 | Chu |
| 6,987,037 B2 | 1/2006 | Forbes |
| 6,994,762 B2 | 2/2006 | Clingman et al. |
| 7,008,854 B2 | 3/2006 | Forbes |
| 7,023,051 B2 | 4/2006 | Forbes |
| 7,041,575 B2 | 5/2006 | Forbes |
| 7,045,874 B2 | 5/2006 | Forbes |
| 7,084,429 B2 | 8/2006 | Forbes |
| 7,115,480 B2 | 10/2006 | Forbes |
| 7,153,753 B2 | 12/2006 | Forbes |
| 2002/0001965 A1 | 1/2002 | Forbes |
| 2002/0048968 A1 | 4/2002 | Ahn |

| | | |
|---|---|---|
| 2002/0062782 A1 | 5/2002 | Norris et al. |
| 2002/0070419 A1 | 6/2002 | Farrar et al. |
| 2002/0070421 A1 | 6/2002 | Ashburn |
| 2002/0076896 A1 | 6/2002 | Farrar et al. |
| 2002/0079557 A1 | 6/2002 | Ahn et al. |
| 2002/0135020 A1 | 9/2002 | Skotnicki et al. |
| 2002/0158322 A1 | 10/2002 | Farrar |
| 2002/0163044 A1 | 11/2002 | Farrar |
| 2002/0163045 A1 | 11/2002 | Farrar |
| 2002/0164859 A1 | 11/2002 | Farrar |
| 2002/0175330 A1 | 11/2002 | Geusic |
| 2002/0185686 A1 | 12/2002 | Christiansen et al. |
| 2003/0013323 A1 | 1/2003 | Hammond et al. |
| 2003/0027406 A1 | 2/2003 | Malone |
| 2003/0042627 A1 | 3/2003 | Farrar et al. |
| 2003/0133683 A1 | 7/2003 | Forbes |
| 2003/0157780 A1 | 8/2003 | Farrar et al. |
| 2003/0190796 A1 | 10/2003 | Geusic |
| 2003/0193088 A1 | 10/2003 | Hall |
| 2003/0197234 A1 | 10/2003 | Farrar |
| 2003/0201468 A1 | 10/2003 | Christiansen et al. |
| 2003/0218189 A1 | 11/2003 | Christiansen et al. |
| 2004/0171196 A1 | 9/2004 | Walitzki |
| 2004/0173798 A1 | 9/2004 | Forbes |
| 2004/0214366 A1 | 10/2004 | Segal et al. |
| 2004/0217352 A1 | 11/2004 | Forbes |
| 2004/0217391 A1 | 11/2004 | Forbes |
| 2004/0224480 A1 | 11/2004 | Forbes |
| 2004/0232422 A1 | 11/2004 | Forbes |
| 2004/0232487 A1 | 11/2004 | Forbes |
| 2004/0232488 A1 | 11/2004 | Forbes |
| 2004/0235264 A1 | 11/2004 | Forbes |
| 2005/0017273 A1 | 1/2005 | Forbes et al. |
| 2005/0020094 A1 | 1/2005 | Forbes et al. |
| 2005/0023529 A1 | 2/2005 | Forbes |
| 2005/0023616 A1 | 2/2005 | Forbes |
| 2005/0029619 A1 | 2/2005 | Forbes |
| 2005/0029683 A1 | 2/2005 | Forbes et al. |
| 2005/0032296 A1 | 2/2005 | Forbes |
| 2005/0087842 A1 | 4/2005 | Forbes |
| 2005/0250274 A1 | 11/2005 | Forbes et al. |
| 2005/0285139 A1 | 12/2005 | Forbes |
| 2006/0001094 A1 | 1/2006 | Forbes |
| 2006/0011982 A1 | 1/2006 | Forbes |
| 2006/0097281 A1 | 5/2006 | Forbes |
| 2006/0208343 A1 | 9/2006 | Forbes |
| 2006/0244105 A1 | 11/2006 | Forbes et al. |
| 2006/0258063 A1 | 11/2006 | Forbes |
| 2006/0258123 A1 | 11/2006 | Forbes |
| 2006/0263994 A1 | 11/2006 | Forbes |
| 2006/0267152 A1 | 11/2006 | Forbes |

FOREIGN PATENT DOCUMENTS

| | | |
|---|---|---|
| EP | 1030196 | 8/2000 |
| EP | 1085352 | 3/2001 |
| JP | 54-152464 A | 11/1979 |
| JP | 54-155770 A | 12/1979 |
| JP | 04-304653 | 10/1992 |
| JP | 2001-093887 | 4/2001 |
| WO | WO-98/35248 | 8/1998 |
| WO | WO-WO02097982 | 12/2002 |

OTHER PUBLICATIONS

Abe, T , "Silicon Wafer-Bonding Process Technology for SOI Structures", *Extended Abstracts of the 22nd (1990 International) Conference on Solid State Devices and Materials*, (1990), 853-856.

Auberton-Herve, A J., "SOI: Materials to Systems", *International Electron Devices Meeting. Technical Digest*, (1996), 3-10.

Autumn, Kellar , et al., "Adhesive force of a single gecko foot-hair", *Nature*, 405(6787), (Jun. 2000), 681-685.

Autumn, Kellar , et al., "Evidence for van der Waals adhesion in gecko setae.", *Proceedings of the National Academy of Science U S A.*; 99(19), (Sep. 17, 2002), 12252-6.

Baginski, T. A., "Back-side germanium ion implantation gettering of silicon", *Journal of the Electrochemical Society*, 135(7), Dept of Electrical Engineering, Auburn Univ, AL,(Jul. 1988), 1842-3.

Ball, Philip , "Why microchips weigh over a kilogram: A small mountain of materials goes into every microchip", *Nature Science Update*, http://www.nature.com/nsu/021028/021028-12.html, (Nov. 2, 2002), 1-2.

Banhart, John , "Manufacture, characterisation and application of cellular metals and metal foams", *Progress in Materials Science*, vol. 46, Issue 6, (2001), 559-632.

Banhart, John , "On the road again: metal foams find favor", *Physics Today*, 55(7), (Jul. 2002), 37-42.

Belford, Rona E., et al., "Performance-Augmented CMOS Using Back-End Uniaxial Strain", *IEEE 60th DRC. Conference Digest Device Research Conference, 2002*, (Jun. 24-26, 2002), 41-42.

Berti, M. , "Composition and Structure of Si-Ge Layers Produced by Ion Implantation and Laser Melting", *Journal of Materials Research*, 6(10), (Oct. 1991), 2120-2126.

Berti, M. , "Laser Induced Epitaxial Regrowth of Si[sub 1-x]Ge[sub x]/Si Layers Produced by Ge Ion Implantation", *Applied Surface Science*, 43, (1989), 158-164.

Bialas, F. , et al., "Intrinsic Gettering of 300 mm CZ Wafers", *Microelectronic Engineering*, 56(1-2), (May 2001), 157-63.

Biever, Celeste , "Secret of 'strained silicon' revealed: behind closed doors, Intel has perfected a novel way to improve chip performance.", *New Scientist*, 180(i2426-2428), (Dec. 20, 2003), 27.

Binns, M. J., et al., "The Realization of Uniform and Reliable Intrinsic Gettering in 200mm P- & P/P Wafers for a Low Thermal Budget 0.18 mu m Advanced CMOS Logic Process", *Diffusion and Defect Data Pt.B: Solid State Phenomena*, 82-84, (2001), 387-92.

Birner, A , "Macroporous silicon: a two-dimensional photonic bandgap material suitable for the near-infrared spectral range", *Physica Status Solidi A*; 165, (Jan. 16, 1998) ,111-117.

Birner, A. , "Silicon-Based Photonic Crystals", *Advanced Materials*, 13(6), (Mar. 2001), 377-388.

Blanco, A , "Large-scale synthesis of a silicon photonic crystal with a complete three-dimensional bandgap near 1.5 micrometres", *Nature*, 405(6785), (May 25, 2000), 437-40.

Blanford, C F., "Gems of Chemistry and Physics: Macroporous Metal Oxides with 3D Order", *Advanced Materials*, 13(6), (Mar. 2001).

Bronner, G. B., et al., "Physical Modeling of Backside Gettering", *Impurity Diffusion and Gettering in Silicon Symposium*, Sponsor: Mater. Res. Soc, Nov. 1984, Boston, MA, (1985), 27-30.

Brown, Chappell , "Bonding twist hints at universal substrate", *EETimes*, (1997), 2 pages.

Bruel, M , "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997), 1636-1641.

Cartagena, E , "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ, (1993), 1199-1200.

Chen, Xiangdong , et al., "Vertical P-MOSFETs with heterojunction between source/drain and channel", *IEEE Device Research Conference*, (2000), 25-26.

Chilton, B T., et al., "Solid phase epitaxial regrowth of strained Si(1–x)Ge(x)/Si strained layer structures amorphized by ion implantation", *Applied Physics Letters*, 54(1), (Jan. 2, 1989), 42-44.

Choe, K. S., et al., "Minority-Carrier Lifetime Optimization in Silicon MOS Devices by Intrinsic Gettering", *Journal of Crystal Growth*, 218(2-4), (Sep. 2000), 239-44.

Clark, Don , et al., "Intel unveils tiny new transistors: Process handles circuits 1/2000th the width of a human hair", *The Wall Street Journal*, (Aug. 13, 2002), 3 pages.

Clifton, P A., et al., "A process for strained silicon n-channel HMOSFETs", *ESSDERC'96. Proceedings of the 26th European Solid State Device Research Conference*, (Sep. 1996), 519-22.

Dharmatilleke, S N., et al., "Anodic Bonding of Glass to Glass and Silicon to Glass or Silicon to Silicon Through a Very Thick Thermally Grown SiO2 Layer", *Proceedings of IS 3M International Symposium on Smart Structures and Microsystems*, http://dolphin.eng.uc.edu/projects/bonding/paper.pdf,(2000), 32.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998), 13-17.

Edrington, A C., "Polymer-Based Photonic Crystals", *Advanced Materials*, 13(6), (Mar. 2001), 421-425.

Fischetti, M V., et al., "Band structure, deformation potentials, and carrier mobility in strained Si, Ge, and SiGe alloys", *Journal of Applied Physics*, 80(4), (Aug. 15, 1996), 2234-2252.

Fournel, F , et al., "Ultra High Precision Of The Tilt/Twist Misorientation Angles In Silicon/Silicon Direct Wafer Bonding", *Abstract—Electronic Materials Conference*, (Jun. 2002), 9.

Garcia, G A., et al., "High-quality CMOS in thin (100 nm) silicon on sapphire", *IEEE Electron Device Letters*, 9(1), (Jan. 1988), 32-34.

Godbole, H. , et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989), 201-3.

Gong, S. S., et al., "Implantation Gettering in Silicon", *Solid-State Electronics*, 30(2), (Feb. 1987), 209-11.

Graf, D. , et al., "300 mm epi pp- wafer: is there sufficient gettering?", *High Purity Silicon VI. Proceedings of the Sixth International Symposium (Electrochemical Society Proceedings* vol. 2000-17) (*SPIE* vol. 4218), (2000), 319-30.

Haddad, H. , et al., "Carbon Doping Effects on Hot Electron Trapping", *28th Annual Proceedings. Reliability Physics 1990*, (Mar. 1990) ,288-9.

Haddad, H. , et al., "Electrical Activity of Bulk Stacking Faults in Silicon", *Materials Letters*, 7(3), Hewlett-Packard Northwest Integrated Circuits Div, Corvallis OR,(Sep. 1988), 99-101.

Harendt, Christine , "Silicon on Insulator Material by Wafer Bonding", *Journal of Electronic Materials*, 20(3), (Mar. 1991), 267-77.

Ho, K , "Existence of a photonic gap in periodic dielectric structures", *Physical Review Letters*, 65(25), (Dec. 17, 1990),3152-3155.

Holland, Brian T., "Synthesis of Macroporous Mineral with Highly Ordered Three-Dimensional Arrays of Spheroidal Voids", *Science*, 281, (Jul. 24, 1998), 538-540.

Imthurn, George P., et al., "Bonded Silicon-on-Sapphire Wafers and Devices", *Journal of Applied Physics*, 72(6), (Sep. 1992), 2526-7.

Iyer, S S., "Separation by Plasma Implantation of Oxygen (SPIMOX) operational phase space", *IEEE trans. on Plasma Science*, 25, (1997), 1128-1135.

Jiang, P , "The Fabrication and Bandgap Engineering of Photonic Multilayers", *Advanced Materials*, 13(6), (Mar. 2001), 389-393.

Joannopoulos, J D., "Photonic crystals : molding the flow of light", Princeton, N.J. : *Princeton University Press*, (1995), 6.

John, S , "Photonic bandgap formation and tunability in certain self-organizing systems", *Journal of Lightwave Technology*, 17(11), (Nov. 1999), 1931-1943.

Johnson, S G., "Guided modes in photonic crystal slabs", *Physical Review B (Condensed Matter)*, 60(8), (Aug. 15, 1999), 5751-8.

Jurczak, M , "SON (silicon on nothing)-a new device architecture for the ULSI era", *VLSI Technology, 1999. Digest of Technical Papers. 1999 Symposium on* , Jun. 14-16, 1999, 29-30.

Kalavade, Pranav , et al., "A novel sub-10 nm transistor", *58th DRC. Device Research Conference. Conference Digest*, (Jun. 19-21, 2000),71-72.

Kang, J. S., et al., "Gettering in Silicon", *Journal of Applied Physics*, 65(8), Center for Solid State Electron Res., Arizona State Univ., Tempe, AZ,(Apr. 15, 1989), 2974-85.

Kostrzewa, M , et al., "Testing the Feasibility of strain relaxed InAsP and InGaAs compliant substrates", *EMC 2003 Internaional Conference Indium Phosphide and Related Materials. Conference Proceedings*, Other authors: G. Grenet et al, (Jun. 2003), 8-9.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA, (Dec. 1983), 1437-41.

Lasky, J. B., "Wafer Bonding for Silicon-on-Insulator Technologies", *Applied Physics Letters*, 48(1), (Jan. 6, 1986), 78-80.

Li, Y. X., et al., "New intrinsic gettering process in Czochralski-silicon wafer", *6th International Conference on Solid-State and Integrated Circuit Technology. Proceedings*, 1(1), (2001), 277-9.

Li, Z Y., "Photonic Bandgaps in Disordered Inverse-Opal Photonic Crystals", *Advanced Materials*, 13(6), (Mar. 2001), 433-436.

Lin, Shawn Yu , "A three-dimensional optical photonic crystal", *Journal of Lightwave Technology*, 17(11), (Nov. 1999), 1944-1947.

Loncar, M , "Waveguiding in planar photonic crystals", *Applied Physics Letters*, 77(13), (Sep. 25, 2000), 1937-1939.

Loo, Y L., et al., "Contact Printing With Nanometer Resolution", *Device Research Conference*, (Jun. 2002), 149-150.

Lu, D, , "Bonding Silicon Wafers by Use of Electrostatic Fields Followed by Rapid Thermal Heating", *Materials Letters*, 4(11), (Oct. 1986), 461-464.

Lu, X. , et al., "SiGe and SiGeC Surface Alloy Formation Using High-Dose Implantation and Solid Phase Epitaxy", *Proceedings of the 11th International Conference on Ion Implantation Technology*, Austin, TX,(1997), 686-689.

Lu, Y , "Three-Dimensional Photonic Crystals with Non-spherical Colloids as Building Blocks", *Advanced Materials*, 13(6), (Mar. 2001), 415-420.

Manoharan, V N., "Photonic Crystals from Emulsion Templates", *Advanced Materials*, 13(6), (Mar. 2001), 447-450.

Miguez, H , "Synthesis and Photonic Bandgap Characterization of Polymer Inverse Opals", *Advanced Materials*, 13(6), (Mar. 2001) ,393-396.

Mitsutake, K , "Theoretical Study on the Formation Process of Empty Space in Silicon (ESS)", *2000 International Conference on Solid State Devices and Materials*, (2000), 198-199.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers*, (2000), 210-211.

Mizushima, I. , "Empty-space-in-silicon technique for fabricating a silicon-on-nothing structure", *Applied Physics Letters*, 77(20), American Institute of Physics, NY,(Nov. 13, 2000), 3290-3292.

Moran, Peter , "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,(Jun. 2002), pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995), 28-32.

Nayak, D.K. , "High performance GeSi quantum-well PMOS on SIMOX", *International Electron Devices Meeting 1992. Technical Digest*, (1992), 777-80.

Ni, P , "Synthetic SiO2 Opals", *Advanced Materials*, 13(6), (Mar. 2001), 437-441.

Nichols, F A., "Surface-(inteface) and volume-diffusion contributions to morphological changes driven by capillarity", *Transactions of the American Institute of Mining, Metallurgical and Petroleum Engineers*, 233(10), (1965), 1840-8.

Norris, D J., "Chemical Approaches to Three-Dimensional Semiconductor Photonic Crystals", *Advanced Materials*, 13(6), (Mar. 2001), 371-376.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo , et al., "Semiconductor Surface with Strain Control", http://www.brl.ntt.co.jp/J/kouhou/katsudou/report00/E/report04_e.html.

Or, B S., et al., "Annealing effects of carbon in n-channel LDD MOSFETs", *IEEE Electron Device Letters*, 12(11), Dept of Electrical & Computing Engr, Oregon State Univ, Corvallis OR,(Nov. 1991), 596-8.

Ouyang, Q., et al., "Bandgap Engineering in Deep Submicron Vertical pMOSFETs", *IEEE 58th DRC. Device Research Conference. Conference Digest*, (2000), 27-28.

Paine, D. C., "The Growth of Strained Si]-xGex Alloys on (100) Silicon Using Solid Phase Epitaxy", *Journal of Materials Research*, 5(5), (May 1990), 1023-1031.

People, R., "Calculation of critical layer thickness versus lattice mismatch for GexSi1−x/Si strained-layer heterostructures", *Applied Physics Letters*, 47(3), (Aug. 1, 1985), 322-4.

Reinhold Publishing Co., "Comparisons of Materials: Coefficient of Thermal Expansion", *Reprinted with permission from "Materials Selector", Reinhold Publishing Co., Penton/IPC*, http://www.handyharmancanada.com/TheBrazingBook/comparis.htm.

Renlund, G., "Silicon oxycarbide glasses: Part II. Structure and properties", *Journal of Materials Research*, 6(12), (Dec. 1991), 2723-2734.

Rim, Kern, et al., "Fabrication and analysis of deep submicron strained-Si n-MOSFET's", *IEEE Transactions on Electron Devices*, 47(7), (Jul. 2000), 1406-1415.

Rim, Kern, et al., "Strained Si NMOSFETs for High Performance CMOS Technology", *2001 Symposium on VLSI Technology. Digest of Technical Papers*, (2001), 59-60.

Rim, Kern, et al., "Transconductance enhancement in deep submicron strained Si n-MOSFETs", *International Electron Devices Meeting 1998. Technical Digest*, (1998), 707-710.

Rubin, L, et al., "Effective gettering of oxygen by high dose, high energy boron buried layers", *1998 International Conference on Ion Implantation Technology. Proceedings*, 2(2), (1998), 1010-13.

Sato, Tsutomu, "A New Substrate Engineering for the Formation of Empty Space in Silicon (ESS) Induced by Silicon Surface Migration", *IEDM Digest, paper 20.6.1*, (1999), 20.6.1-20.6.4.

Sato, T, "Trench transformation technology using hydrogen annealing for realizing highly reliable device structure with thin dielectric films", *1998 Symposium on VLSI Technology Digest of Technical Papers*, (1998), 206-7.

Smith, C J., "Low-loss channel waveguides with two-dimensional photonic crystal boundaries", *Applied Physics Letters*, 77(18), (Oct. 30, 2000), 2813-2815.

Subramania, G, *Advanced Materials*, 13(6), Inverse Face-Centered Cubic Thin Film Photonic Crystals,(Mar. 2001), 443-446.

Sugiyama, N, et al., "Formation of strained-silicon layer on thin relaxed-SiGe/SiO/sub 2//Si structure using SIMOX technology", *Thin Solid Films*, 369(1-2), (Jul. 2000), 199-202.

Suni, T, et al., "Effects of Plasma Activation on Hydrophilic Bonding of Si and SiO2", *Journal of the Electrochemical Society*, 149, (2002), G348-51.

Suyal, N, et al., "A solid state 29Si and 13C NMR study on the synthesis of thin silicon-oxycarbide glass sheets by a sol-gel route", *Journal of Materials Chemistry*, 9(12), (1999), 3061-3067.

Suyal, N, et al., "Microstructural and Dielectric Characterization of Sol-Gel Derived Silicon Oxycarbide Glass Sheets", *Journal of Sol-Gel Science and Technology*, 14 (1), (1999) ,113-123.

Suyal, N, et al., "Sol-gel synthesis & microstructural characterization of silicon oxycarbide glass sheets with high fracture strength and high modulus", *Journal of Sol-Gel Science & Technology*, (1998), 995-999.

Sze, S. M., "Physics of Semiconductor Devices", *New York, Wiley-Interscience*, ISBN: 0471842907, (1969), 402-407.

Takagi, Shin-Ichi, "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002), 37-40.

Tan, T. Y., et al., "Intrinsic gettering by oxide precipitate induced dislocations in Czochralski Si", *Applied Physics Letters*, 30(4), (Feb. 15, 1977), 175-6.

Tessier, P M., "Structured Metallic Films for Optical and Spectroscopic Applications via Colloidal Crystal Templating", *Advanced Materials*, 13(6), (Mar. 2001) ,396-400.

Verdonckt-Vandebroek,, Sophie, et al., "SiGe-Channel Heterojunction p-MOSFET's", *IEEE Transactions on Electron Devices*, 41(1), (Jan. 1994), 90-101.

Welser, J, et al., "Strain dependence of the performance enhancement in strained-Si n-MOSFETs", *IEEE Internaional Electron Devices Meeting 1994. Technical Digest*, (Dec. 11-14, 1994), 373-376

Whitwer, F. D., et al., "DLTS characterization of precipitation induced microdefects", *Materials Issues in Silicon Integrated Circuit Processing Symposium*, (Apr. 1986), 53-57.

Wijaranakula, W., et al., "Effect of Pre- and Postepitaxial Depostion Annealing on Oxygen Precipitation in Silicon", *Journal of Materials Research*, 1(5), Dept of Electr & Comput Eng, Oregon State Univ, Corvallis, OR,(Sep.-Oct. 1986), 698-704.

Wijaranakula, W., et al., "Effect of preanneal heart treatment on oxygen precipitation in epitaxial silicon", *Materials Issues in Silicon Integrated Circuit Processing Symposium*, (Apr. 1986), 139-44.

Wijaranakula, W., et al., "Internal Gettering Heat Treatments and Oxygen Precipitation in Epitaxial Silicon Wafers", *Journal of Materials Research*, 1(5), Dept of Electr & Comput. Eng, Oregon State Univ., Corvallis, OR,(Sep.-Oct. 1986), 693-7.

Wijaranakula, W., et al., "Oxygen precipitation in p/p+(100) epitaxial silicon material", *Journal of the Electrochemical Society*, 134(9), SEH America, Inc., Mater. Characterization Lab., Vancouver, WA,(Sep. 1987), 2310-16.

Wild, Dipl.ing. M., "Laser Assisted Bonding of Silicon and Glass in Micro-System Technology", http://www.ilt.fhg.de/eng/jb00-s42.html, Fraunhofer ILT—jb00-s42, (2003), 1.

Xia, Y, "Photonic Crystals", *Advanced Materials*, 13(6), (Mar. 2001), 369.

Xia, Y, "Self-Assembly Approaches to Three-Dimensional Photonic Crystals", *Advanced Materials*, 13(6), (Mar. 2001), 409-413.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000), 67-68.

Yablonovitch, E, "Inhibited spontaneous emission in solid-state physics and electronics", *Physical Review Letters*, 58(20), (May 18, 1987), 2059-62.

Yablonovitch, E, "Photonic band structure: the face-centered-cubic case employing nonspherical atoms", *Physical Review Letters*, 67(17), (Oct. 21, 1991), 2295-8.

Yang, D., et al., "Intrinsic Gettering in Nitrogen Doped Czochralski Crystal Silicon", *High Purity Silicon VI. Proceedings of the Sixth International Symposium (Electrochemical Society Proceedings vol. 2000-17) (SPIE vol. 4218)*, (2000), 357-61.

Yang, Deren, et al., "Nitrogen in Czochralski Silicon", *2001 6th International Conference on Solid-State and Integrated Circuit Technology. Proceedings*, 1(1), (2001), 255-60.

Yang, P, "Patterning Porous Oxides within Microchannel Networks", *Advanced Materials*, 13(6), (Mar. 2001), 427-431.

Yin, Haizhou, "High Ge-Content Relaxed Si1-xGex Layers by Relaxation on Complaint Substrate with Controlled Oxidation", *Electronic Materials Conference*, Santa Barbara, Jun. 2002, 8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996), 31.

Zhu, Z H., et al., "Wafer bonding technology and its applications in optoelectronic devices and materials", *IEEE Journal of Selected Topics in Quantum Electronics*, (Jun. 1997), 927-936.

Kal, S., et al., "Strained Silicon-SiGe Devices Using Germanium Implantation", *IETE Journal of Research*, 43 (2-3), (Mar. 1997), 185-192.

Xiao, Q., et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004), 2163-2166.

* cited by examiner

ULTRA-THIN SEMICONDUCTORS BONDED ON GLASS SUBSTRATES

CROSS REFERENCE TO RELATED APPLICATIONS

This application is a Divisional under 37 C.F.R. 1.53(b) of U.S. application Ser. No. 10/443,340, filed May 21, 2003, which application is incorporated herein by reference in its entirety.

This application is related to the following commonly assigned U.S. patent application, U.S. application Ser. No. 10/443,355, filed May 21, 2003, entitled: "Silicon Oxycarbide Substrates for Bonded Silicon on Insulator," now U.S. Pat. No. 7,008,854, which is incorporated by reference in its entirety.

TECHNICAL FIELD

This application relates generally to electronic devices and device fabrication and, in particular, semiconductor on insulator devices and their fabrication.

BACKGROUND

Almost half the energy expended by a silicon microchip during its manufacture and lifetime is spent in producing the silicon wafer material, and another quarter is spent during the operating lifetime of the microchip. A technique that reduces the energy associated with fabrication of the silicon material and power consumption during operation will reduce the overall cost of the silicon microchip integrated circuit.

Power consumption during operation can be reduced using silicon on insulator (SOI) technology. The use of SOI technology not only results in a lower power consumption but also increased speed of operation of integrated circuits due to a reduction in stray capacitance. For SOI structures, thin layers of silicon on insulator can be fabricated using several well known techniques such as separation by implantation of oxygen (SIMOX), separation by plasma implantation of oxygen (SPIMOX), silicon on sapphire (SOS), bonded wafer processes on silicon, and silicon bonded on sapphire.

Bonded wafer processes on silicon involve technologies to bond monocrystalline silicon materials onto semiconductor wafers and oxidation processes to form the semiconductor on insulator. In these technologies, a portion of one or both of the bonded wafers is removed, typically, by polishing methods. Another process to remove large portions of a bonded wafer uses a "Smart cut" technology. "Smart cut" technology generally refers to a process in which a material is implanted into a silicon substrate to a particular depth and ultimately utilized to crack the substrate.

There continues to be a need to provide fabrication processes and structures to reduce the overall cost for a silicon microchip integrated circuit.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. Both wafer and substrate can include doped and undoped semiconductors, epitaxial semiconductor layers supported by a base semiconductor or insulator, as well as other semiconductor structures well known to one skilled in the art.

The following detailed description is, therefore, not to be taken in a limiting sense, and the scope of the present invention is defined only by the appended claims, along with the full scope of equivalents to which such claims are entitled.

Figure 1:
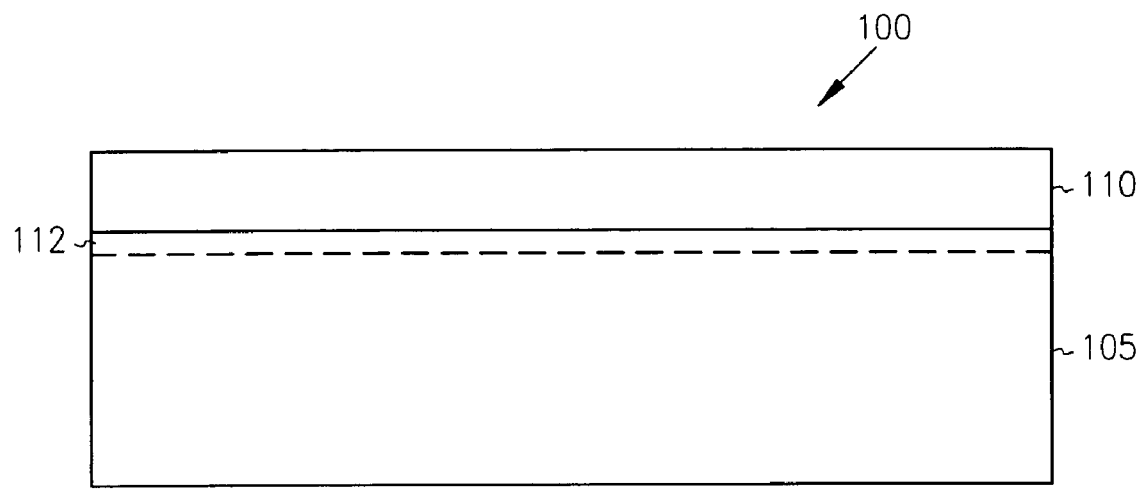
FIG. 1 illustrates an embodiment of a semiconductor on insulator, according to the present invention.

FIG. 1 illustrates an embodiment of a semiconductor on insulator structure 100. Semiconductor on insulator structure 100 includes a glass substrate 105, and an ultra-thin semiconductor layer 110 bonded to the glass substrate 105. Semiconductor on insulator structure 100 is configured with semiconductor layer 105 having a thickness such that semiconductor layer 105 does not yield due to temperature-induced strain at device processing temperatures. Temperature-induced strain includes strain that is produced in a material combined with another material as a result of mismatches in the coefficients of thermal expansion of the two materials.

In an embodiment, an insulator layer 112 is disposed between semiconductor layer 110 and glass substrate 105. Insulator layer 112 can be an oxide of a semiconductor material contained in semiconductor layer 110. In an embodiment, semiconductor layer 110 includes a silicon layer. In an embodiment where semiconductor layer 110 includes a silicon layer having insulator layer 112, insulator layer 112 is a silicon oxide, which can include a native silicon oxide. However, insulator layer 112 is not limited to an oxide and can include other insulator materials. Insulator layer 112 can provide further reduction of stray capacitances and/or be used in processing device circuitry in the semiconductor on insulator structure. Additionally, semiconductor layer 110 can include and is not limited to a semiconductor layer containing germanium, gallium arsenide, a silicon-germanium compound, and other semiconductor materials as are known to those skilled in the art.

In an embodiment, glass substrate 105 can be a fused quartz substrate or a fused silica substrate. Alternately, glass substrate 105 includes a borosilicate glass substrate. An embodiment includes a thin silicon layer 110 on a glass substrate 105, where the glass substrate 105 can include a fused silica substrate, a fused quartz substrate, or a borosilicate glass substrate. The use of glass substrates serves to reduce the energy consumption and costs of fabricating a silicon microchip that are typically associated with producing high quality crystalline substrates in which the majority of the silicon substrate is not used in any device function and serves only as a carrier substrate. The use of high quality, high cost crystalline substrates as such a carrier substrate is typically not an efficient use of resources.

Figure 2:
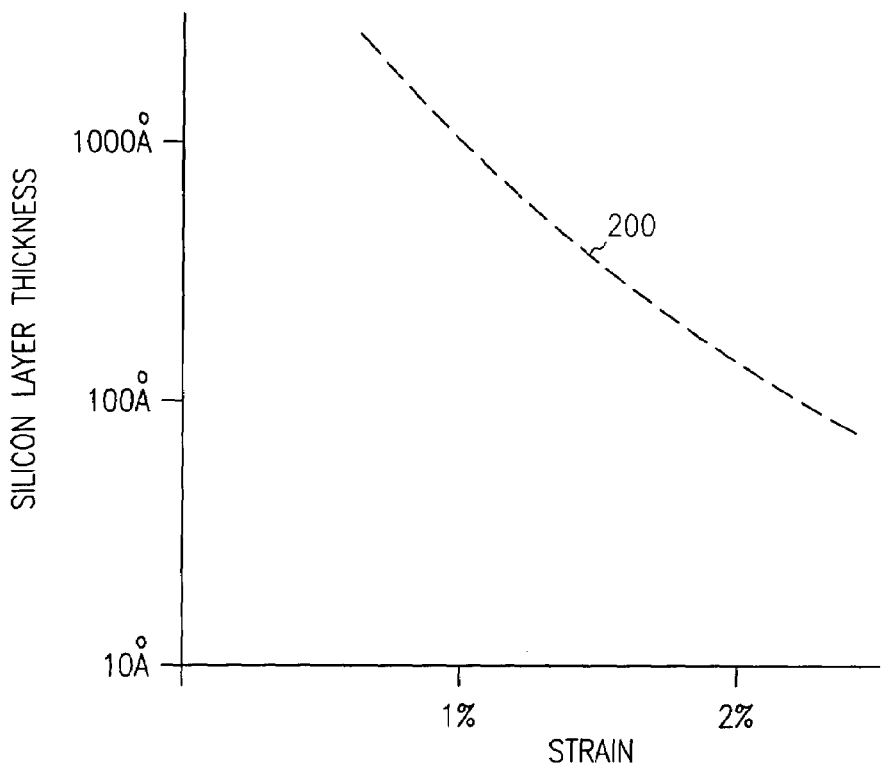
FIG. 2 illustrates a relationship between silicon layer thickness and strain.

In addition to efficient use of resources, fabrication concerns are associated with processing devices in a wafer at elevated temperatures. For instance, a silicon on insulator structure where the silicon is bonded to a substrate is subject to problems during device formation using varying temperature processes. One of the problems associated with temperature processing in a bonded wafer technology involves the difference in coefficients of thermal expansion between the bonded materials. For example, the coefficients of thermal expansion for some commonly used materials includes silicon carbide with a coefficient of thermal expansion of 4.0 to $3.9 \times 10\text{-}6$ cm/(cm K), silicon oxide with a coefficient of thermal expansion of $0.5 \times 10\text{-}6$ cm/(cm K), and silicon with a coefficient of thermal expansion of $2.6 \times 10\text{-}6$ cm/(cm K). Associated with these differences in the coefficients of thermal expansion is the creation of excessive stress when bonding thick layers when there is a mismatch in the coefficients of thermal expansion. The development of excessive stress can result in exceeding the strain limit of the materials. FIG. 2 provides an example of the limits on strain versus silicon layer thickness, where the dashed line 200 delineates the onset for yield, plastic deformation and defects in bulk silicon samples. If the strain is too large the materials will plastically deform by the introduction of dislocations, fracture and yield, or undergo excessive wafer bowing and/or warping. An approach to reduce stress includes bonding silicon on to compliant substrates using low viscosity borophosphorosilicate glass films, which flows to reduce the stress. Another approach is to use materials where the coefficients of thermal expansion match as closely as possible.

An embodiment of a method for forming a semiconductor on insulator structure includes providing a glass substrate, providing a semiconductor substrate, and performing a bonding cut process on the semiconductor wafer and the glass substrate to provide a thin semiconductor layer bonded to the glass substrate. The thin semiconductor layer is formed to a thickness such that it does not yield due to temperature-induced strain at device processing temperatures. In an embodiment, the glass substrate can be a fused silica substrate, a fused quartz substrate, or a borosilicate glass substrate. In an embodiment, a silicon layer bonded to a glass substrate provides a silicon on insulator structure in which circuitry for electronic devices is configured.

Fused silica and fused quartz have a very high UV transmission, an extremely low coefficient of thermal expansion, a high temperature and chemical resistance, low loss dielectric properties, and electrical insulating properties. Applications for fused silica or fused quartz include optical reference flats, windows, mirrors, test plates, high temperature view ports, optical components, aerospace applications, solar cells, and passive energy collectors.

One generally known and commonly used borosilicate glass having a low coefficient of expansion, which has typically been used for heat-resistant glassware in cooking and chemistry, is PYREX. PYREX has a low coefficient of thermal expansion, a high chemical, acid and temperature resistance, and high energy transmission properties with wider spectral band than soda lime in both infrared and ultraviolet ranges. PYREX is used for dielectric coating substrates, neutron absorbers, and in high temperature, long-term, extreme environmental applications. Embodiments of the present invention include PYREX material as a glass substrate for semiconductor on insulator structures.

These glass materials can be provided in the form of wafers at costs significantly less than the costs associated with providing high quality, crystalline semiconductor wafers. Thus, application of these materials in semiconductor device processing can reduce the overall cost to manufacture the device.

In embodiments, devices using the semiconductor on insulator structure of the present invention include circuitry in a thin semiconductor layer. In an embodiment, the circuitry is configured in a thin silicon layer bonded to a glass substrate. The thin silicon layer is monocrystalline allowing circuitry in the silicon layer, such as transistors, to have the performance level associated with devices having structures using single crystalline form. Having devices using single crystalline structures avoids the problems associated with grain boundaries of polycrystalline devices such as thin film polycrystalline transistors.

Figure 3:
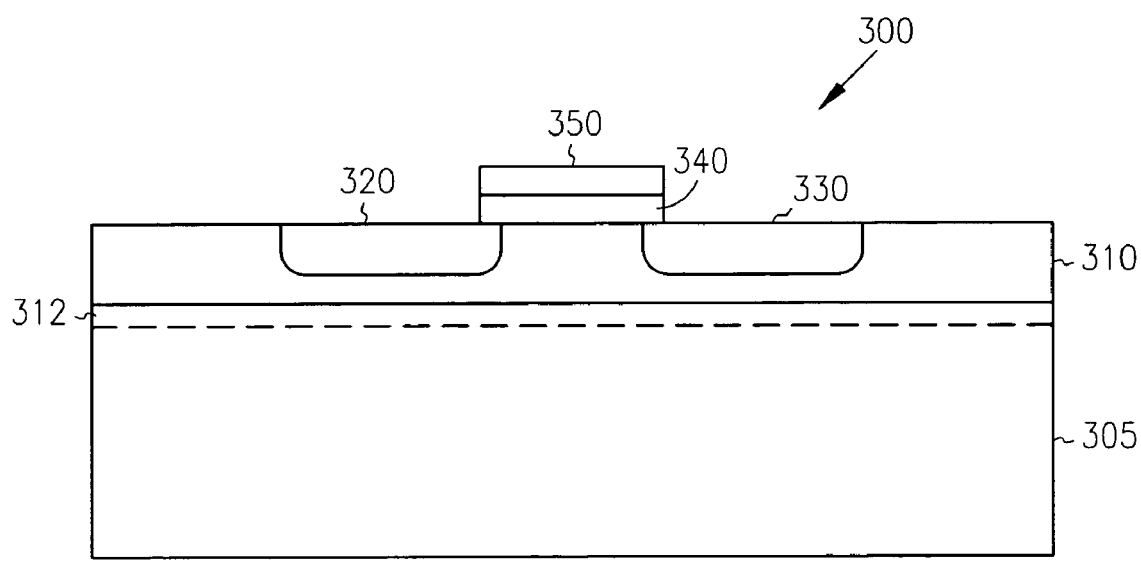
FIG. 3 depicts an embodiment of an electronic device using a semiconductor on insulator structure, according to the present invention.

FIG. 3 depicts an embodiment of an electronic device 300 using a semiconductor on insulator structure. Electronic device 300 includes a glass substrate 305, a thin semiconductor layer 310 bonded to glass substrate 305, where semiconductor layer 310 has a thickness such that the semiconductor layer does not yield due to temperature-induced strain at device processing temperatures, and circuitry in thin semiconductor layer 310. FIG. 3 also depicts a transistor having a source 320, a drain 330, a gate dielectric 340 disposed between source 320 and drain 330, and a gate 350 disposed on gate dielectric 340, where the transistor is an example of the circuitry for an electronic device 300 using a semiconductor on insulator structure. An embodiment of an electronic device using a semiconductor on insulator as described herein is not limited to a transistor, but includes electronic devices using such a semiconductor on insulator structure. In an embodiment, the circuitry of electronic device 300 includes a memory circuit.

In an embodiment for electronic device, in addition to insulating glass substrate 305, electronic device 300 can include an insulating layer 312 between thin semiconductor layer 310 and glass substrate 305. Insulator layer 312 can be a oxide of a semiconductor material contained in semiconductor layer 310. In an embodiment, semiconductor layer 310 includes a silicon layer. In an embodiment, semiconductor layer 310 includes a silicon layer having an insulating layer 312, where insulator layer 312 is a silicon oxide, which can include a native silicon oxide. However, insulator layer 312 is not limited to an oxide and can include other insulator materials. Additionally, semiconductor layer 310 can include and is not limited to a semiconductor layer containing silicon, germanium, gallium arsenide, a silicon-germanium compound, and other semiconductor materials as are known to those skilled in the art.

In an embodiment, glass substrate 305 includes a fused quartz substrate or a fused silica substrate. Alternately, glass substrate 305 includes a borosilicate glass substrate. An embodiment includes a thin silicon layer 310 on a glass substrate 305, where the glass substrate 305 includes a fused silica substrate, a fused quartz substrate, or a borosilicate glass substrate.

Various embodiments of electronic device 300 include fully depleted devices using CMOS device technology, and various embodiments include partially depleted devices. Devices using a partially depleted CMOS process can be configured with or without floating bodies. The structure, formation, and operation of CMOS devices are understood by those skilled in the art.

Embodiments for electronic devices using semiconductor on insulator structures as described herein have an isolated device area realized on an insulating substrate. Stray capacitances are minimized because the device drain, source, and/or collectors are on an insulating glass layer. Interconnection wire is configured over an isolation oxide and the insulating substrate to minimize wiring capacitance. Reducing these parasitic capacitances reduces power consumption during circuit operation and increases the speed of operation.

Figure 4:
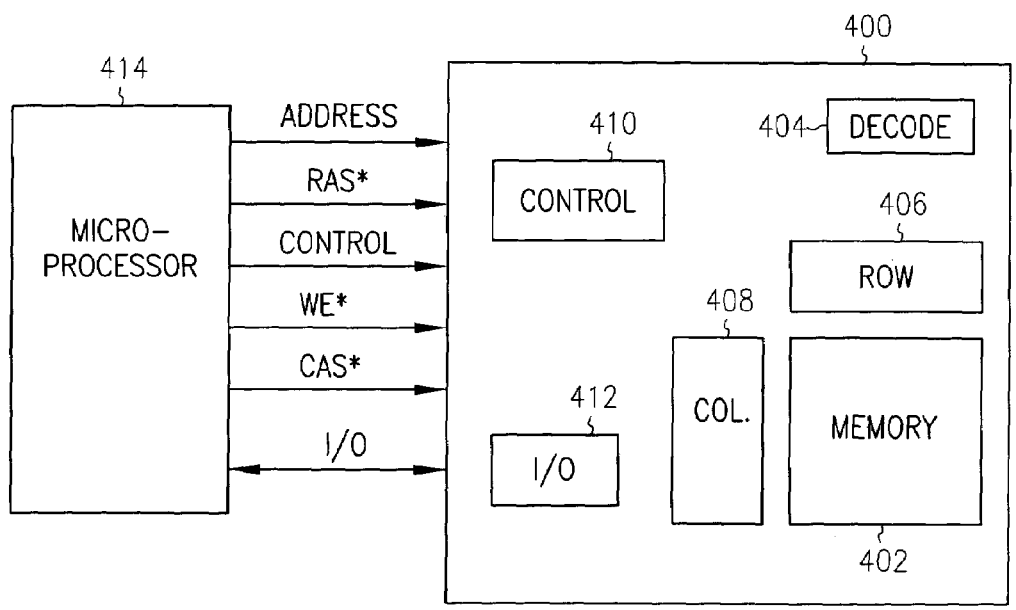
FIG. 4 is a simplified block diagram of a memory device using an embodiment of a semiconductor on insulator structure, according to the present invention.

FIG. 4 is a simplified block diagram of a memory device 400 using an embodiment of a semiconductor on insulator structure. Memory device 400 includes an array of memory cells 402, address decoder 404, row access circuitry 406, column access circuitry 408, control circuitry 410, and Input/Output circuit 412. The memory is operably coupled to an external microprocessor 414, or memory controller for memory accessing. Memory device 400 receives control signals from processor 414, such as WE*, RAS* and CAS* signals, which can be supplied on a system bus. Memory device 400 stores data that is accessed via I/O lines. It will be appreciated by those skilled in the art that additional circuitry and control signals can be provided, and that the memory device of FIG. 4 has been simplified to help focus on the present invention. At least one of the integrated circuit structures is formed in a silicon layer that is part of a semiconductor on insulator structure, such as a silicon on glass structure, according to an embodiment of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 5:
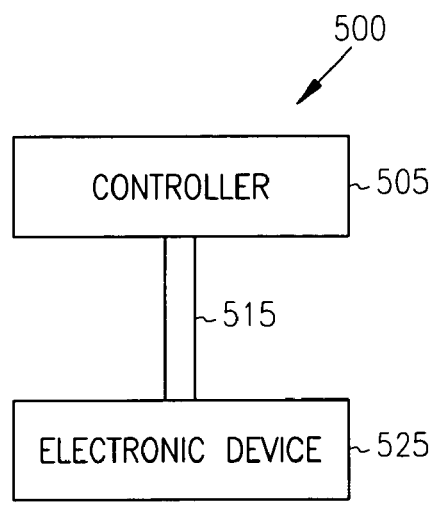
FIG. 5 illustrates a block diagram for an electronic system having devices that use an embodiment of a semiconductor on insulator structure, according to the present invention.

FIG. 5 illustrates a block diagram for an electronic system 500 having devices using an embodiment for a semiconductor on insulator structure. Electronic system 500 includes a controller 505, a bus 515, and an electronic device 525, where bus 515 provides electrical conductivity between controller 505 and electronic device 525. In various embodiments, controller 505 and/or electronic device 525 includes an embodiment for a semiconductor on insulator structure as previously discussed having a glass substrate and a thin semiconductor layer bonded to the glass substrate. The thin semiconductor layer has a thickness such that the semiconductor layer does not yield due to temperature-induced strain at device processing temperatures. In an embodiment, electronic system 500 includes a plurality of electronic devices using an embodiment for a semiconductor on insulator structure according to the present invention. Electronic system 500 may include, but is not limited to, information handling devices, wireless systems, telecommunication systems, fiber optic systems, electro-optic systems, and computers.

Figure 6:
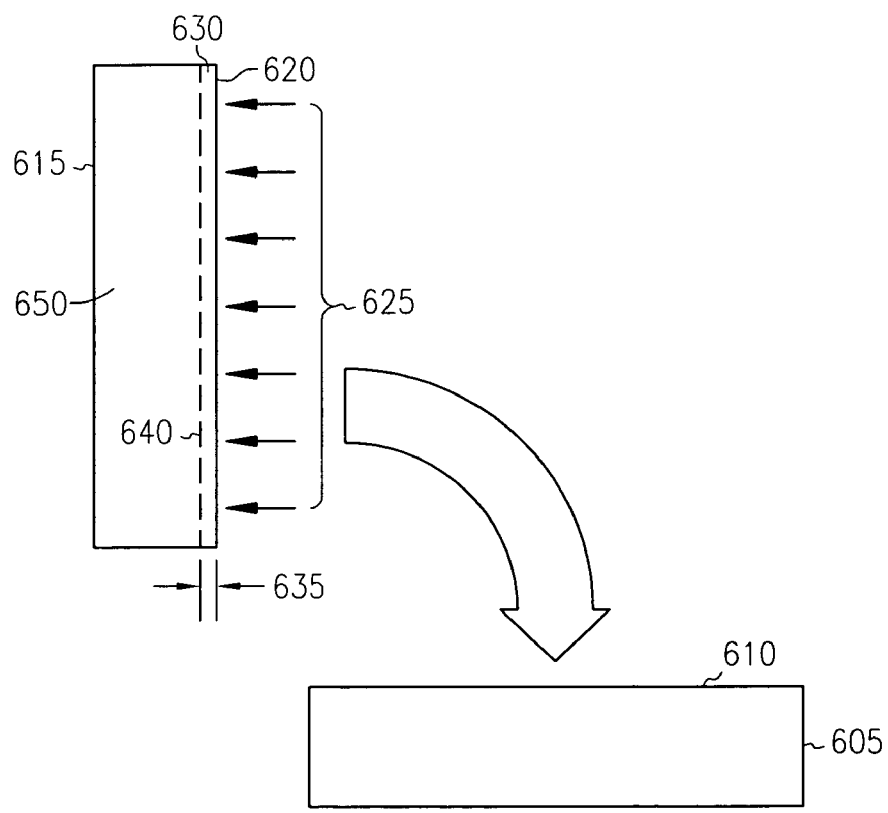
FIG. 6 illustrates the relationship of elements in an embodiment for a method to form a semiconductor on insulator structure, according to the present invention.

FIG. 6 illustrates the relationship of elements in an embodiment for a method to form a semiconductor on insulator structure according to the present invention. An embodiment for a method to form a semiconductor on insulator structure includes providing a glass substrate, providing a semiconductor wafer, and performing a bonding cut process on the semiconductor wafer and the glass substrate to provide a thin semiconductor layer bonded to the glass substrate. The semiconductor layer bonded to the glass substrate has a thickness such that the semiconductor layer does not yield due to temperature-induced strain at device processing temperatures.

Herein, a bonding cut process refers to a process in which two substrates, or wafers, are bonded together and a section of at least one of the two wafers is cut or broken off after attaching the two wafers together. For each wafer for which a section is cut or broken off, the wafer is conditioned prior to the actual cut by implanting atoms to a predetermined distance into the wafer to be cut. The attached wafers are heated to cut the conditioned wafers and to bond further the remaining portions of the two wafers at the attachment plane. The section removed from a conditioned wafer is the section of the conditioned wafer from the end of the conditioned wafer, which is away from the attachment to the other wafer, to the plane along the conditioned wafer that is at the distance to which the implantation was made. The removed section includes a significant portion of the original wafer, with the smaller portion that was subjected to implantation remaining bonded to the other wafer.

In an embodiment, a glass substrate 605 provided for fabricating a semiconductor on insulator structure includes a substrate of glass material. The glass material can include fused silica, fused quartz, and borosilicate glass. In an embodiment, the glass substrate is generated from thin glass sheets. The thin glass sheets can include sheets of fused silica, fused quartz, or borosilicate glass with a very low sodium concentration. These glass sheets are polished and cut into wafer size patterns to act as substrates for integrated circuits. These wafer size glass sheets forming glass substrates are relatively inexpensive as compared with silicon substrates. After patterning the glass substrates, these glass substrates can be further chemically and mechanically polished.

Semiconductor wafer 615 is conditioned as part of the bonding cut process prior to bonding to glass substrate 605. Semiconductor wafer 615 can include wafers having semiconductor material that includes, but is not limited to, silicon, germanium, silicon-germanium, gallium arsenide, indium phosphide, and other semiconductor materials. For ease of discussion regarding embodiments according to the present invention, the remainder of this discussion focuses on an embodiment using a silicon wafer as semiconductor wafer 615.

Silicon wafer 615, a single crystal wafer, is conditioned by subjecting a surface 620 to implantation of ions 625 to form an intermediate silicon layer 630 having a thickness 635. The ions are implanted along a plane 640, represented in FIG. 6 as a line, which is approximately parallel to surface 620. In an embodiment, hydrogen ions are used as implantation ions 625. The hydrogen ions can take the form of $H^+$, $H_2^+$, $D^+$, or $D_2^+$ ions. The implanted ions act to form cavities along the cleavage plane 640. The cavities are joined through thermal processing. Once these cavities join, the wafer becomes cut or broken off along plane 640. In an embodiment, silicon wafer 615 is also conditioned by forming an oxide on surface 620. The oxide can include a native oxide. The ion implantation can be performed before or after the oxide formation.

After conditioning silicon wafer 615, silicon wafer 615 and glass substrate 605 can be cleaned using conventional cleaning procedures. In an embodiment, silicon wafer 615 is also conditioned by forming an oxide on surface 620 before applying a cleaning procedure. Then, surface 620 of silicon wafer 615, with or without an oxide layer formed thereon, is attached to a surface 610 of glass substrate 605. This attachment provides a bonding of silicon wafer 615 to glass substrate 605, typically by using Van der Walls forces. Then, silicon wafer 615 is further bonded to glass substrate 605 causing a section 650 of silicon wafer 615 to cut or break off along cleavage plane 640.

As a result of this bonding cut, intermediate silicon layer 630 is bonded to glass substrate 605. Intermediate silicon layer 630 is defined by the depth of ion implantation to line 640 and has a thin thickness 635. In an embodiment, thickness 635 is generated to a thickness such that intermediate silicon layer 630 does not yield due to temperature-induced strain at device processing temperatures allowing intermediate silicon layer 630 to be used as the thin semiconductor layer 110 as depicted in FIG. 1. In an embodiment, intermediate silicon layer 630 has a thickness of about 0.1 microns. In an embodiment, intermediate silicon layer 630 has a thickness less than 0.1 microns. As a result of the thin nature of intermediate silicon layer 630, section 650 is relatively thick and has the form of a silicon substrate. Section 650 can be used with another glass substrate to form another silicon on insulator structure, during which fabrication another remaining section from the bond cut process becomes available to be used with yet another glass substrate. This reduces the overall cost for the manufacturing process of a wide variety of electronic devices.

In an embodiment, plasma enhanced bonding is used to bond intermediate silicon layer 630 to glass substrate 605 and cut or break off section 650. In an embodiment, the bonding cut process includes raising the temperature of silicon wafer 615 attached to glass substrate 605 to a temperature ranging from about 400° C. to about 600° C. to cut or break off section 650. Then, the resulting bond between intermediate silicon layer 630 and glass substrate 605 can be strengthened by raising the temperature to a range from about 800° C. to about 1000° C. or annealing by laser assisted annealing. Though bonding of the silicon wafer 615, with or without an oxide layer on surface 620, can be accomplished with anodic bonding, anodic bonding for a CMOS process introduces high alkali concentration, which is not appropriate for the CMOS process.

In an embodiment, polishing intermediate silicon layer 630 that is bonded to glass substrate 605, with or without an insulating layer between silicon layer 630 and glass substrate 605, thins intermediate silicon layer 630. This subsequent polishing processes provides a thin silicon layer for the silicon on insulator structure. In an embodiment, intermediate silicon layer 630 is polished to provide an ultra-thin silicon layer having a thickness of about 0.1 micron. In an embodiment, intermediate silicon layer 630 is polished to provide an ultra-thin silicon layer having a thickness of less than 0.1 microns.

Once the bond cut process is concluded providing an ultra-thin silicon layer bonded to a glass substrate, a silicon on insulator structure is ready for device processing. Further, removed section 650 can be used to fabricate other silicon on insulator wafers. As previously discussed, embodiments include other semiconductor materials in place of the silicon to provide a thin semiconductor layer on a glass substrate such that the thin semiconductor layer does not yield due to temperature-induced strain at device processing temperatures. Thermal processing for the bond cut is performed by temperatures appropriate for the semiconductor wafer used.

Once the semiconductor on insulator wafer has been formed, device processing can be accomplished using conventional processes and procedures. For example, silicon on glass substrates formed according to the present invention can be further processed in a manner similar to silicon-on-sapphire wafers. In an embodiment, fully depleted CMOS devices can be fabricated by masking device areas with oxide and nitride and oxidizing the silicon in between device mesas, followed by conventional device fabrication techniques.

In an embodiment for forming an electronic device using a silicon on insulator structure according to the present invention, partially depleted CMOS devices can be formed with or without floating bodies. A layer of silicon thicker than for a fully depleted CMOS process is used and the thicker silicon layer is patterned by a trench isolation process similar to a SIMOX process. After patterning the silicon layer by the trench isolation, conventional techniques are used to process the device.

In embodiments using a semiconductor on insulator structure as described herein, an isolated silicon device area is realized on an insulating substrate. Stray capacitances are minimized because the device drain, source, and/or collectors are on an insulating glass layer. Interconnection wire is configured over an isolation oxide and the insulating substrate to minimize wiring capacitance. Reducing these parasitic capacitances reduces power consumption during circuit operation and increases the speed of operation.

In an embodiment, a method including the procedures and processes for forming a semiconductor on insulator structure and for forming devices and systems with elements using a semiconductor on insulator structure are controlled by a computer according to the teachings of the present invention. The instructions for the method are stored in a computer readable format on a computer readable media. Examples of such computer readable media include but are not limited to laser readable disks, magnetic disks and tape, and computer memory.

CONCLUSION

Use of silicon substrates as a carrier substrate in which the majority of the silicon substrate is not used in any device function is not an efficient use of resources. Embodiments of the present invention include the use of glass substrates that serve to reduce the energy consumption and costs of fabricating a silicon microchip that are typically associated with producing high quality crystalline substrates. Performing a bonding cut process on a semiconductor wafer and a glass wafer to form a semiconductor on insulator structure having a thin semiconductor layer in which electronic circuitry can be formed has several attributes. By bonding to a glass substrate a semiconductor layer having a thickness such that the semiconductor layer does not yield due to temperature-induced strain at device processing temperatures, problems associated with differences in the coefficient of thermal expansion can be avoided. The cost associated with providing glass substrates is significantly less than the cost for providing high quality semiconductor wafers such as silicon wafers. Performing a bond cut process as described herein allows a ultra-thin semiconductor layer to be taken from a high quality semiconductor wafer, such as a silicon wafer, to form a semiconductor on insulator wafer and at the same time provide for use of the same high quality semiconductor wafer to form a plurality of semiconductor on insulator structures. Further, such semiconductor on insulator wafers formed according to embodiments of the present invention provide an isolated device area on an insulating substrate where stray device capacitances and wiring capacitances are minimized. Reducing these parasitic capacitances reduces power consumption during circuit operation and increases the speed of operation.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. A semiconductor structure comprising:
   a borosilicate glass substrate; and
   a semiconductor layer bonded directly in contact to the borosilicate glass substrate without an alkali concentration associated with anodic bonding, the semiconductor layer having a thickness such that the semiconductor layer does not yield due to temperature-induced strain at device processing temperatures, the semiconductor layer being a monocrystalline semiconductor layer.

2. The semiconductor structure of claim 1, wherein the thickness is less than a thickness correlated to onset of yield for the semiconductor layer at a maximum temperature-induced strain of the semiconductor layer.

3. The semiconductor structure of claim 1, wherein the semiconductor layer is a silicon layer.

4. A semiconductor structure comprising:
   a glass substrate, the glass substrate being selected from a group consisting of a fused silica substrate and a fused quartz substrate; and
   a semiconductor layer bonded directly in contact to the glass substrate, the semiconductor layer having a thickness such that the semiconductor layer does not yield due to temperature-induced strain at device processing temperatures, the semiconductor layer being a monocrystalline semiconductor layer.

5. The semiconductor structure of claim 4, wherein the thickness is less than a thickness correlated to onset of yield for the semiconductor layer at a maximum temperature-induced strain of the semiconductor layer.

6. An electronic device comprising:
   a semiconductor layer bonded directly in contact to a borosilicate glass substrate without an alkali concentration associated with anodic bonding, the semiconductor layer having a thickness such that the semiconductor layer does not yield due to temperature-induced strain at device processing temperatures, the semiconductor layer being a monocrystalline semiconductor layer; and
   circuitry in the semiconductor layer.

7. The electronic device of claim 6, wherein the semiconductor layer is a silicon layer.

8. An electronic device comprising:
   a semiconductor layer bonded directly in contact to a glass substrate, the semiconductor layer having a thickness such that the semiconductor layer does not yield due to temperature-induced strain at device processing temperatures, the semiconductor layer being a monocrystalline semiconductor layer and the glass substrate being selected from a group consisting of a fused silica substrate and a fused quartz substrate; and
   circuitry in the semiconductor layer.

9. The electronic device of claim 8, wherein the monocrystalline semiconductor layer is disposed across the glass substrate.

10. An electronic device comprising:
    a semiconductor layer bonded directly in contact to a glass substrate, the semiconductor layer having a thickness such that the semiconductor layer does not yield due to temperature-induced strain at device processing temperatures, the semiconductor layer being a monocrystalline semiconductor layer and the glass substrate being selected from a group consisting of a fused silica substrate, a fused quartz substrate, and a borosilicate glass substrate; and
    circuitry in the semiconductor layer, wherein the semiconductor layer is a silicon layer having a thickness of about 0.1 microns.

11. The semiconductor structure of claim 10, wherein the monocrystalline semiconductor layer is disposed across the glass substrate.

12. An electronic device comprising:
    a semiconductor layer bonded to a glass substrate, the semiconductor layer having a thickness such that the semiconductor layer does not yield due to temperature-induced strain at device processing temperatures, the semiconductor layer being a monocrystalline semiconductor layer and the glass substrate being selected from a group consisting of a fused silica substrate, a fused quartz substrate, and a borosilicate glass substrate; and
    circuitry in the semiconductor layer, wherein the semiconductor layer is a silicon layer having a thickness less than 0.1 microns.

13. The electronic device of claim 12, further including an oxide layer between the silicon layer and the glass substrate.

14. A memory comprising:
    an array of memory cells; and
    an address decoder coupled to the array, wherein the array and the address decoder are formed on a semiconductor structure including:
    a borosilicate glass substrate, and
    a semiconductor layer bonded directly in contact to the borosilicate glass substrate without an alkali concentration associated with anodic bonding, the semiconductor layer having a thickness such that the semiconductor layer does not yield due to temperature-induced strain at device processing temperatures, the semiconductor layer being a monocrystalline semiconductor layer.

15. The memory of claim 14, wherein the semiconductor layer has a thickness of about 0.1 microns.

16. A memory comprising:
an array of memory cells; and
an address decoder coupled to the array, wherein the array and the address decoder are formed on a semiconductor structure including:
   a glass substrate, the glass substrate being selected from a group consisting of a fused silica substrate and a fused quartz substrate; and
   a semiconductor layer bonded directly in contact to the glass substrate, the semiconductor layer having a thickness such that the semiconductor layer does not yield due to temperature-induced strain at device processing temperatures, the semiconductor layer being a monocrystalline semiconductor layer.

17. The memory of claim 16, wherein the memory is a dynamic random access memory.

18. A memory comprising:
an array of memory cells; and
an address decoder coupled to the array, wherein the array and the address decoder are formed on a semiconductor structure including:
   a glass substrate, the glass substrate being selected from a group consisting of fused silica substrate, a fused quartz substrate, and a borosilicate glass substrate; and
   a semiconductor layer bonded to the glass substrate, the semiconductor layer having a thickness such that the semiconductor layer does not yield due to temperature-induced strain at device processing temperatures, the semiconductor layer being a monocrystalline semiconductor layer, wherein the semiconductor layer is a silicon layer having a thickness less than 0.1 microns.

19. The semiconductor structure of claim 18, further including an oxide layer between the silicon layer and the glass substrate.

20. An electronic system comprising:
a controller;
a bus; and
an electronic device coupled to the controller by the bus, the electronic device including:
   a borosilicate glass substrate;
   a semiconductor layer bonded directly in contact to the borosilicate glass substrate without an alkali concentration associated with anodic bonding, the semiconductor layer having a thickness such that the semiconductor layer does not yield due to temperature-induced strain at device processing temperatures, the semiconductor layer being a monocrystalline semiconductor layer; and
   a circuit on the semiconductor layer.

21. The electronic system of claim 20, wherein the semiconductor layer has a thickness less than 0.1 microns.

22. An electronic system comprising:
a controller;
a bus; and
an electronic device coupled to the controller by the bus, the electronic device including:
   a glass substrate, the glass substrate being selected from a group consisting of a fused silica substrate and a fused quartz substrate;
   a semiconductor layer bonded directly in contact to the glass substrate, the semiconductor layer having a thickness such that the semiconductor layer does not yield due to temperature-induced strain at device processing temperatures, the semiconductor layer being a monocrystalline semiconductor layer; and
   a circuit on the semiconductor layer.

23. The electronic system of claim 22, wherein the monocrystalline semiconductor layer is disposed across the glass substrate.

24. An electronic system comprising:
a controller:
a bus; and
an electronic device coupled to the controller by the bus, the electronic device including:
   a glass substrate, the glass substrate being selected from a group consisting of fused silica substrate, a fused quartz substrate, and a borosilicate glass substrate;
   a semiconductor layer bonded directly in contact to the glass substrate, the semiconductor layer having a thickness such that the semiconductor layer does not yield due to temperature-induced strain at device processing temperatures, the semiconductor layer being a monocrystalline semiconductor layer; and
   a circuit on the semiconductor layer, wherein the semiconductor layer is a silicon layer having a thickness of about 0.1 microns.

25. The memory of claim 24, wherein the monocrystalline semiconductor layer is disposed across the glass substrate.

26. An electronic system comprising:
a controller;
a bus; and
an electronic device coupled to the controller by the bus, the electronic device including:
   a glass substrate, the glass substrate being selected from a group consisting of fused silica substrate, a fused quartz substrate, and a borosilicate glass substrate;
   a semiconductor layer bonded to the glass substrate, the semiconductor layer having a thickness such that the semiconductor layer does not yield due to temperature-induced strain at device processing temperatures, the semiconductor layer being a monocrystalline semiconductor layer; and
   a circuit on the semiconductor layer, wherein the semiconductor layer is a silicon layer having a thickness less than 0.1 microns.

27. The electronic system of claim 26, wherein the electronic device includes an oxide layer between the silicon layer and the glass substrate.

28. An electronic system comprising:
a processor;
a system bus; and
a memory device coupled to the processor by the system bus, the memory device including:
   a glass substrate, the glass substrate being selected from a group consisting of fused silica substrate, a fused quartz substrate, and a borosilicate glass substrate;
   a silicon layer bonded to the glass substrate, the silicon layer having a thickness less than 0.1 microns, the silicon layer being a monocrystalline silicon layer; and
   a memory circuit on the semiconductor layer.

29. The electronic system of claim 28, wherein the glass substrate is a fused silica substrate or a fused quartz substrate.

30. The electronic system of claim 28, wherein the glass substrate is a borosilicate glass substrate.

31. The electronic system of claim 28, further including an oxide layer between the silicon layer and the glass substrate.

32. The electronic system of claim 28, wherein the silicon layer is disposed across the glass substrate.

* * * * *